(12) United States Patent
Kikuchi et al.

(10) Patent No.: US 6,696,734 B2
(45) Date of Patent: Feb. 24, 2004

(54) LDD HIGH VOLTAGE MOS TRANSISTOR

(75) Inventors: Shuichi Kikuchi, Gunma (JP); Eiji Nishibe, Gunma (JP); Takuya Suzuki, Saitama (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/829,258

(22) Filed: Apr. 9, 2001

(65) Prior Publication Data

US 2002/0094642 A1 Jul. 18, 2002

(30) Foreign Application Priority Data

Jan. 16, 2001 (JP) ..................................... P. 2001-008020

(51) Int. Cl.[7] ............................................... H01L 29/76
(52) U.S. Cl. ..................... 257/408; 257/355; 257/356; 257/409
(58) Field of Search .................................. 257/355, 356, 257/408, 409

(56) References Cited

U.S. PATENT DOCUMENTS

| 5,517,046 | A | * | 5/1996 | Hsing et al. ................. 257/336 |
| 5,844,272 | A | * | 12/1998 | Soderbarg et al. ........... 257/328 |
| 6,033,948 | A | * | 3/2000 | Kwon et al. ................. 438/217 |
| 6,255,154 | B1 | * | 7/2001 | Akaishi et al. .............. 438/217 |

* cited by examiner

*Primary Examiner*—Richard Elms
*Assistant Examiner*—Christian D. Wilson

(57) ABSTRACT

A semiconductor device has a gate electrode formed on P type semiconductor substrate through a gate insulation film, a low concentration N− type drain region formed so as to be adjacent to the gate electrode, a high concentration N+ type drain region separated from the other end of said gate electrode and included in said low N− type drain region, and a middle concentration N type layer having high impurity concentration peak at a position of the predetermined depth in said substrate at a region spanning at least from said gate electrode to said high concentration N+ type drain region, and formed so that high impurity concentration becomes low at a region near surface of the substrate.

6 Claims, 8 Drawing Sheets

LDD HIGH VOLTAGE MOS TRANSISTOR

BACKGROUND OF THE INVENTION

1. Field of the Invention

The present invention relates to a semiconductor device and a method of manufacturing the device, particularly to technique improving operation sustaining voltage characteristic of high sustaining voltage MOS transistor for high voltage of power source (HV-VDD) used for an LCD driver, an EL driver and so on.

2. Description of the Related Art

A semiconductor device according to the related art will be described below referring a section view of an LDD type high sustaining voltage MOS transistor shown in FIG. 12.

In FIG. 12, a gate electrode 53 is formed on a P type semiconductor substrate (P-Sub) 51 through a gate insulation film 52. An N+ type source region 54 is formed so as to be adjacent to one end of said gate electrode 53, an N− type drain region 56 is formed facing said source region 54 through a channel region and further separated from the other end of the gate electrode 53, and an N+ type drain region 57 is formed so as to be included in an N− type drain region 56.

In the prior art, a low concentration N− type drain region 56 is formed by thermal diffusion of about 1000° C. to 1100° C. so as to form a gentle slope and a deep diffusion layer.

However, even with such the construction, voltage between source and drain (BVDS: sustaining voltage at OFF) is high, but sustaining voltage (VSUS: sustaining voltage at ON) being operation sustaining voltage of the voltage is about 30 V at most in the prior art.

A mechanism decreasing the above-mentioned operation sustaining voltage will be described below.

In such the N channel type high sustaining voltage MOS transistor, a horizontal bipolar transistor 60 having the drain region 57 as corrector (N+), the source region 54 as emitter (N+), and the semiconductor substrate 51 as base (P) is formed parasitically as shown in FIG. 13 and FIG. 14. Decreasing of operation sustaining voltage VSUS even if voltage between source and drain BVDS being sustaining voltage at OFF is caused by ON of the parasitical bipolar transistor 60. Thus, operation range of the N channel type high sustaining voltage MOS transistor is limited and operation at all over the range is difficult.

An operation of said bipolar transistor 60 will be described below.

AS shown in FIG. 13, gate voltage (VG)(>Vt: threshold voltage) is added to the gate electrode 53, voltage of a drain electrode (VD) (>>VG) contacting the drain region 57 is added, and a positive feedback loop described later (refer FIG. 15) is formed in the case of ON of the MOS transistor.

That is, ① avalanche multiplication generates in a depletion layer by electron of a channel region 62 accelerated at a depletion layer near the drain region 57 so as to generate a pair of an electron and a hole. ② Said hole flows in the substrate (substrate current: ISub) ③ Said substrate current (ISub) generates voltage slope in the semiconductor substrate 51 to raise substrate voltage. ④ Junction between the source region 54 and the substrate 51 is biased to forward direction. ⑤ Electron is implanted from the source region 54 to the substrate 51. ⑥ The implanted electron reaches he drain region 57 and further occurs avalanche multiplication.

Thus, by forming the positive feedback of ① to ⑥, large current flows in the device so as to break the device.

Therefore, in design of the N channel type high sustaining voltage MOS transistor, conditions of the design is set considering the above-mentioned phenomenon. First, a transistor construction decreasing substrate current (ISub) is adopted because operation sustaining voltage (VSUS) becomes small as substrate current (ISub) becomes large, and second, the conditions are decided so as to decrease substrate current (ISub) at an actually used region.

FIG. 4 is a substrate current (ISub) vs. gate voltage (VG) characteristic view, in the figure, double humps characteristic of substrate current (ISub) at high region in gate voltage (VG) rises about the conventional N channel type high sustaining voltage MOS transistor (shown with a dotted line in the figure). Therefore, operation sustaining voltage (VSUS) is low shown in drain current (ID) vs. drain voltage (VD) characteristic view of FIG. 5 and a characteristic view showing operation sustaining voltage of FIG. 6.

The double humps characteristic is caused by concentration of electric field by spreading the depletion layer near the N+ drain region at high region in gate voltage (VG).

Although it is considered to increase ion implantation volume (doze) and to rise concentration of N− type drain region as shown in FIG. 6 to improve operation sustaining voltage (VSUS), the conventional semiconductor device is not improved enough in sustaining voltage as shown with white circles. Because concentration of end portion A of the N− type drain region 56 shown in FIG. 12 rises conversely, problems of increase of short channel effect by that depletion layer spreads to the channel region 55 direction, increase of snap back phenomenon by increase of peak value of substrate current (ISub), and further decrease of voltage between source and drain (BVDS) occur. Therefore, there is not effective means improving operation-sustaining voltage.

Therefore, an object of the invention is to provide a semiconductor device capable of improving operation sustaining voltage and a method of manufacturing the device.

SUMMARY OF THE INVENTION

A semiconductor device of the invention has a gate electrode formed on at least one conductive type semiconductor substrate through a gate insulation film, a low concentration reverse conductive type drain region formed so as to be adjacent to the gate electrode, a high concentration reverse conductive type drain region separated from the other end of said gate electrode and included in said low concentration reverse conductive type drain region, and a middle concentration reverse conductive type layer having high impurity concentration peak at a position of the predetermined depth in said substrate at a region spanning at least from said gate electrode to said high concentration reverse conductive type drain region, and formed so that high impurity concentration becomes low at a region near surface of the substrate. Therefore, the semiconductor device is characterized in improving operation-sustaining voltage.

Especially said middle concentration reverse conductive type layer is formed at a region spanning at least from a position separated the predetermined space from said gate electrode to said high concentration reverse conductive type drain region. Therefore, electric field concentration at the end portion of the gate electrode can be defused and higher sustaining voltage becomes possible.

A method of manufacturing a semiconductor device has processes of forming a low concentration reverse conductive type drain region on at least one conductive type semiconductor substrate, forming a gate insulation film at the entire surface of said semiconductor substrate, forming a gate electrode overlapping at least upper side of said drain region by patterning after forming a conductive film on the entire surface, forming a high concentration reverse conductive type source region adjacent to one end of said gate electrode and a high concentration reverse conductive type drain region separated from the other end of said gate electrode and included in said low concentration reverse conductive type drain region, and forming a middle concentration reverse conductive type layer having high impurity concentration peak at a position of the predetermined depth in said substrate at a region spanning at least from the position having the predetermined space from said gate electrode to said high concentration reverse conductive type drain region, and formed so that high impurity concentration becomes low at a region near surface of the substrate.

Phosphorus ion is ion-implanted with high acceleration energy of about 100 KeV to 200 KeV at said forming process of the middle concentration reverse conductive type layer. Thus, the semiconductor device has high impurity concentration at a position of the predetermined depth in the substrate and the middle concentration reverse conductive type layer. Thus, the semiconductor device has high impurity concentration can be formed so that high impurity concentration becomes low at a region near surface of the substrate.

Ion-implantation is carried out at a region spanning from a position separated the predetermined space from said gate electrode to said high concentration reverse conductive type drain region by ion implantation by using at least a photo-resist as a mask at said forming process of the middle concentration reverse conductive type layer.

Ion-implantation is carried out at a region spanning from a position separated the predetermined space from the gate electrode to said high concentration reverse conductive type drain by ion implantation region by using at least a side wall insulation film formed as a mask at a side wall portion of said gate electrode at said forming process of the middle concentration reverse conductive type layer.

Ion-implantation is carried out at a region spanning from a position separated the predetermined space from said gate electrode to said high concentration reverse conductive type drain region by using at least a photo-resist as a mask after forming the gate electrode by isotropic etching the conductive film by ion implantation by using the photo-resist formed on the conductive film for forming said gate electrode as a mask at said forming process of the middle concentration reverse conductive type layer.

Said middle concentration reverse conductive type layer is formed at a region spanning from a position separated the predetermined space from the gate electrode to said high concentration reverse conductive type drain region by ion implantation from oblique upper side of the gate electrode by using said gate electrode as a mask at said forming process of the middle concentration reverse conductive type layer.

Said middle concentration reverse conductive type layer is formed at a region spanning from a position separated the predetermined space from the gate electrode to said high concentration reverse conductive type drain region by ion implantation from oblique upper side of the gate electrode by using a photo-resist formed so as to cover said gate electrode as a mask at said forming process of the middle concentration reverse conductive type layer.

Said middle concentration reverse conductive type layer is formed at a region spanning from an end portion of the gate electrode to said high concentration reverse conductive type drain region by ion implantation by using said gate electrode as a mask at said forming process of the middle concentration reverse conductive type layer.

DETAILED DESCRIPTION OF THE PREFERRED EMBODIMENTS

Embodiments of a semiconductor device and a method of manufacturing the same of the invention will be described below referring figures.

Figure 3:
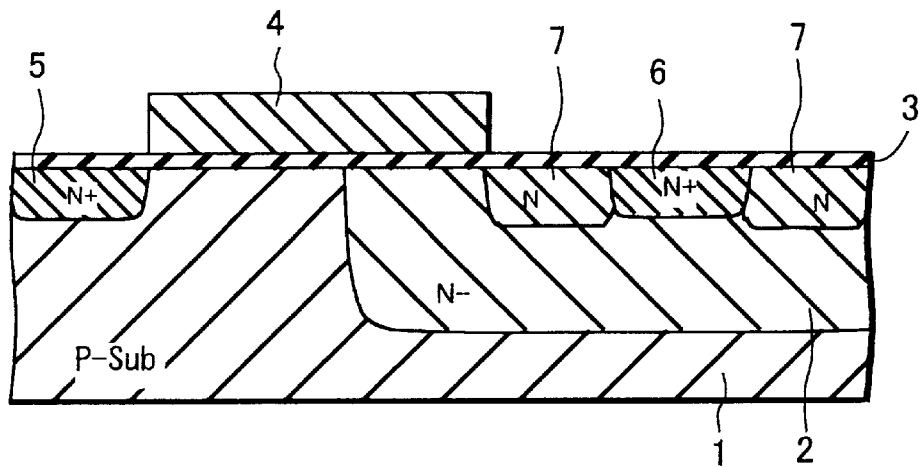
FIG. 3 is a third section view showing a method of manufacturing a semiconductor device of a first embodiment of the present invention.

In a semiconductor device of a first embodiment according to the invention, a gate insulation film 3 is formed on one conductive type semiconductor substrate, for example, P type semiconductor substrate 1, and a gate electrode 4 is formed through the gate insulation film 3 as FIG. 3. A high concentration reverse conductive (N+) type source region 5 is formed so as to be adjacent to one end of said gate electrode 4, a low concentration reverse conductive (N−) type drain region 2 is formed so as to face said source region 5 through a channel region under the gate electrode 4, and further, a high concentration reverse conductive (N+) type drain region 6 is formed so as to be separated from the other end of said gate electrode 4 and included in said low concentration N− type drain region 2. A middle concentration reverse conductive (N) type layer 7 is formed at a region spanning at least from said gate electrode 4 to said high concentration N+ type drain region 6. Said N type layer 7 has high impurity concentration peak at a position of the predetermined depth in said substrate, and is formed so that high impurity concentration becomes low at region near surface of the substrate.

A method of manufacturing the above-mentioned semiconductor device will be described below.

Figure 1:
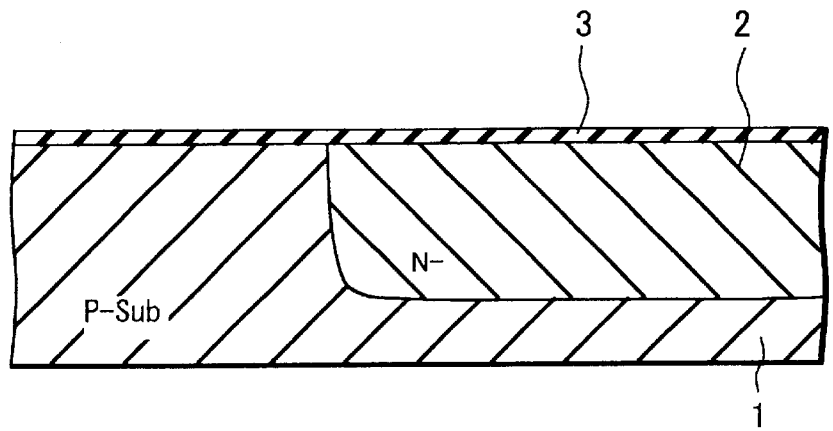
FIG. 1 is a first section view showing a method of manufacturing a semiconductor device of a first embodiment of the present invention.

First, N type impurity, for example, phosphorus ion ($^{31}$P$^+$) is ion-implanted into a P type silicon substrate 1 with 100 KeV in acceleration voltage and $6 \times 10^{12}$/cm$^2$ in implantation volume (dose), an N− type drain region 2 is formed by thermal diffusion with 1100° C., 2 hours, and after that, a gate insulation film 3 of 100 nm thickness is formed by thermal oxidation on said substrate 1 as shown in FIG. 1.

Figure 2:
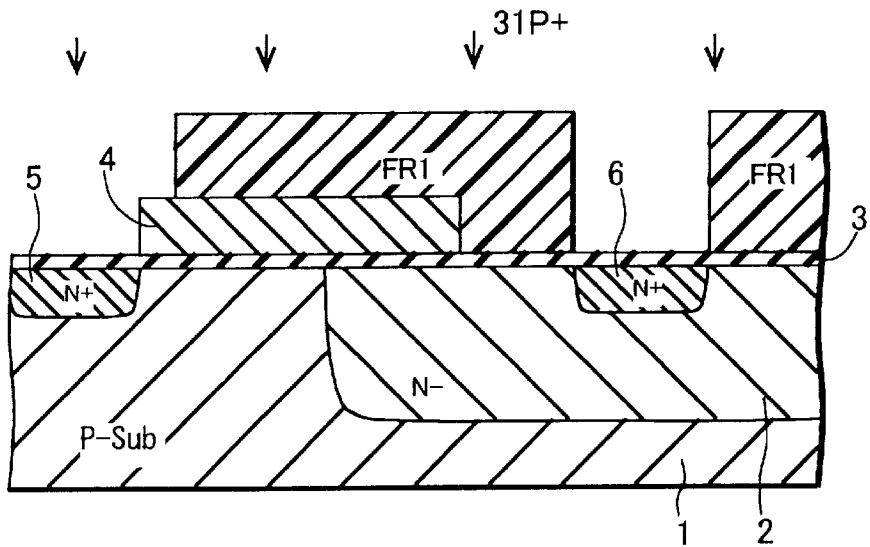
FIG. 2 is a second section view showing a method of manufacturing a semiconductor device of a first embodiment of the present invention.

Next, after forming a conductive film, for example, a polysilicon film is formed at the entire surface, a gate electrode 4 of 400 nm in thickness in which one end thereof extends on said N− type drain region 2 shown in FIG. 2 by patterning the polysilicon film using well-known patterning technique.

An N+ type source region 5 and an N+ type drain region 6 separated from the other end of the gate electrode 4 and included in said N− type drain region 2 are formed as shown in FIG. 2 by ion implanting phosphorus ion ($^{31}$P$^+$) with 80 KeV in acceleration voltage and about $6 \times 10^{15}$/cm$^2$ in implantation volume (dose) by using a photo-resist FR1 as a mask.

Figure 16:
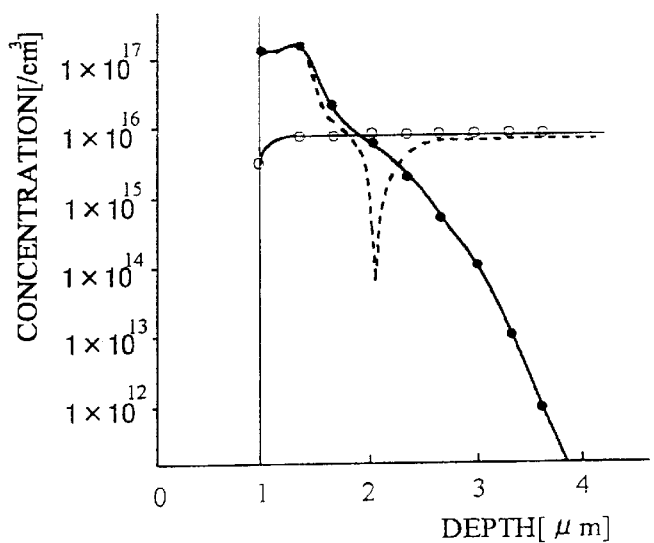
FIG. 16 is a view showing a relationship between a depth of a middle concentration layer and a concentration of the device of the first embodiment.

Next, a middle concentration N type layer 7 is formed at from the other end of said gate electrode 4 to near an N+ drain region 6 included in said N− type drain region 2 as shown in FIG. 3 by ion-implanting phosphorus ion ($^{31}$ P$^+$), for example, with 160 KeV in acceleration voltage and about $2 \times 10^{12}$/cm$^2$ in implantation volume (dose) by using a photo-resist (not shown) formed on said gate electrode 4 as a mask. Here, said middle concentration N type layer is formed so as to have high impurity concentration peak at position of the predetermined depth in the substrate and so that high impurity concentration becomes the lower at region the nearer surface of the substrate by ion-implanting phosphorus ion ($^{31}$P$^+$) comparatively long in flying distance (comparing with arsenic ion and the like) with comparatively high acceleration energy (about 100 KeV to 200 KeV, in the embodiment, acceleration voltage of about 160 KeV) comparing with acceleration energy (80 KeV) at ion implantation for forming N+ type source and drain regions 5 and 6. a relationship between a depth of a middle concentration layer and a concentration of the device of the first embodiment is shown in FIG. 16. A vertical axis shows an impurity concentration, and horizontal axis shows a depth of the middle concentration layer.

By the process, the N+ type drain region 6 can be surrounded by the middle concentration N type layer 7 with keeping concentration of a channel side drain region end portion in lower concentration by the N− type drain region 2.

Figure 4:
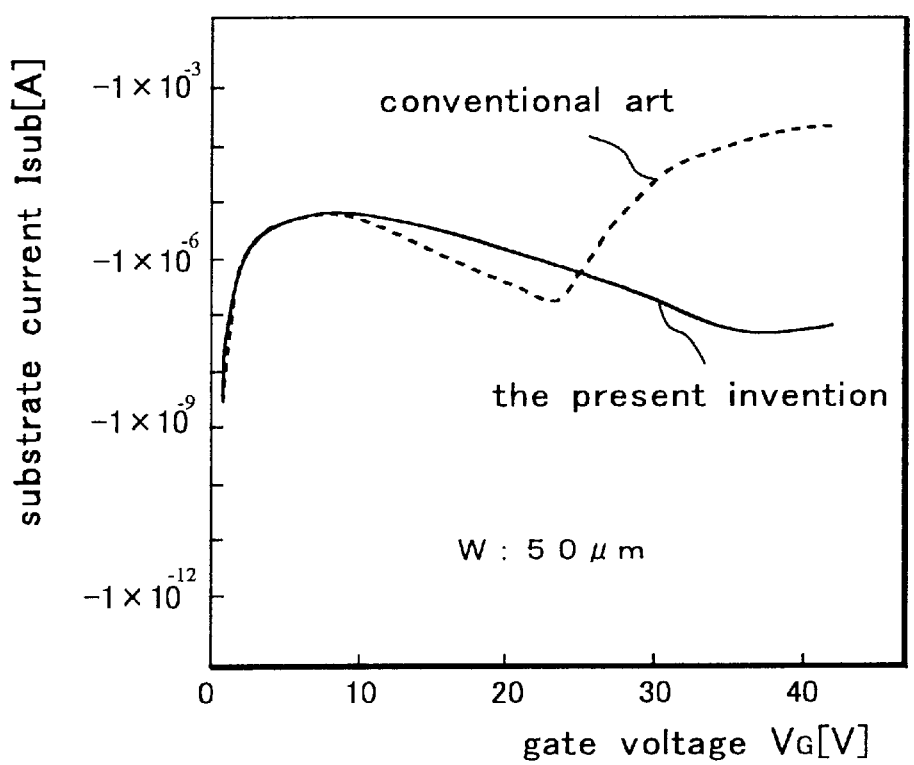
FIG. 4 is a view showing substrate current (ISub) vs. gate voltage (VG) of a semiconductor device of the invention and the conventional semiconductor device.
Figure 5:
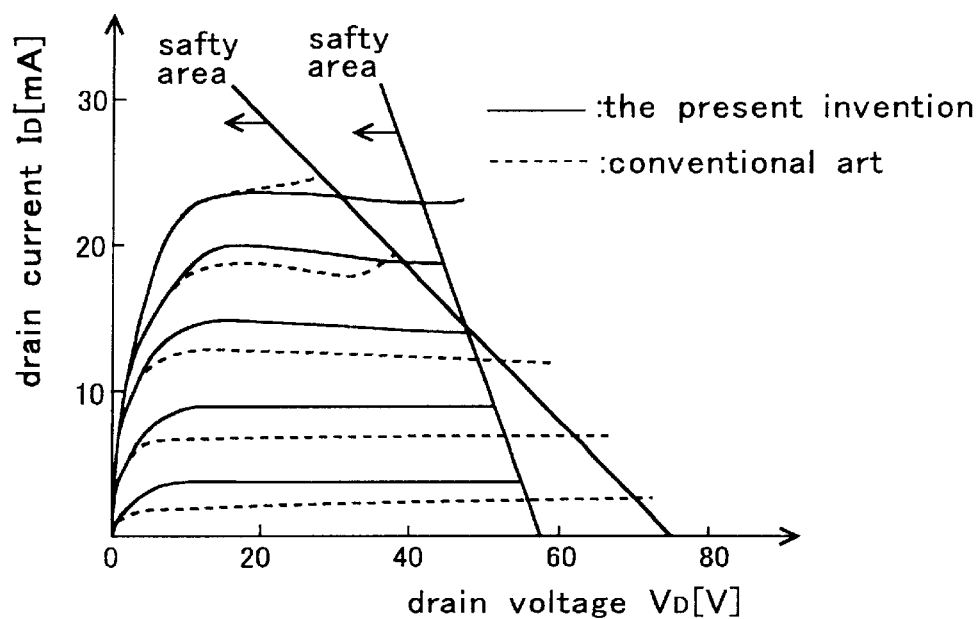
FIG. 5 is a view showing drain current (ID) vs. drain voltage (VD) of a semiconductor device of the invention and the conventional semiconductor device.
Figure 6:
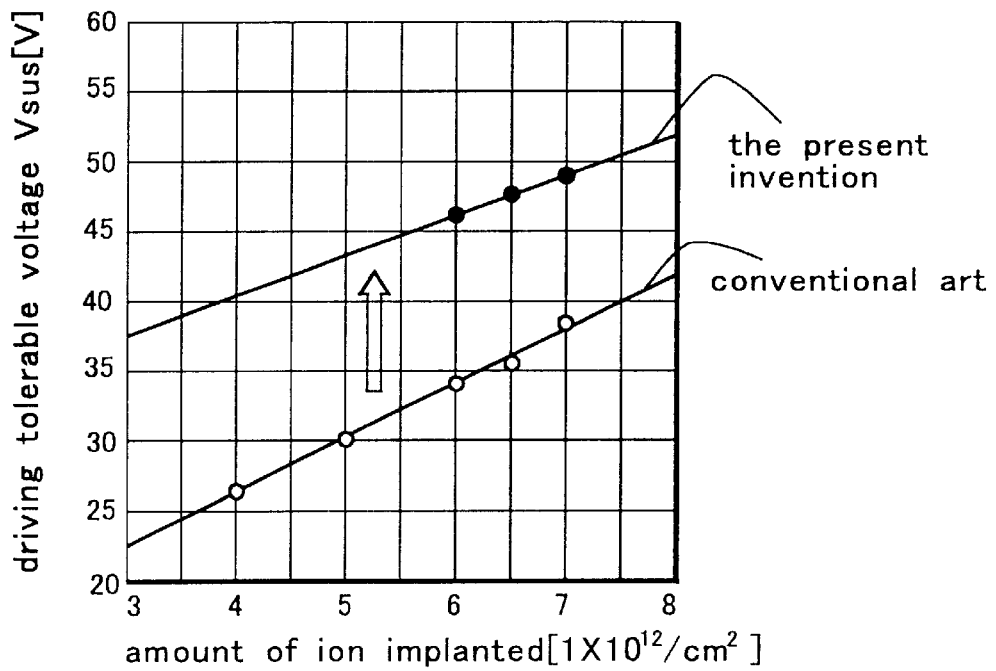
FIG. 6 is a view showing operation sustaining voltage of a semiconductor device of the invention and the conventional semiconductor device.

As described above, the semiconductor device of the invention removes double hump characteristic and can decrease substrate current (ISub) at high gate voltage (VG) region as shown with a solid line in FIG. 4 by surrounding said high concentration N+ type drain region 6 by the middle concentration N type layer 7 and by letting the depletion layer not extend to the N+ type drain region. Thus, operation sustaining voltage (VSUS) improves as shown in FIG. 5 and FIG. 6. Especially, sustaining voltage improves extremely at high gate voltage (VG) and high drain current (ID).

Next, a second embodiment of the invention will be described.

Figure 7:
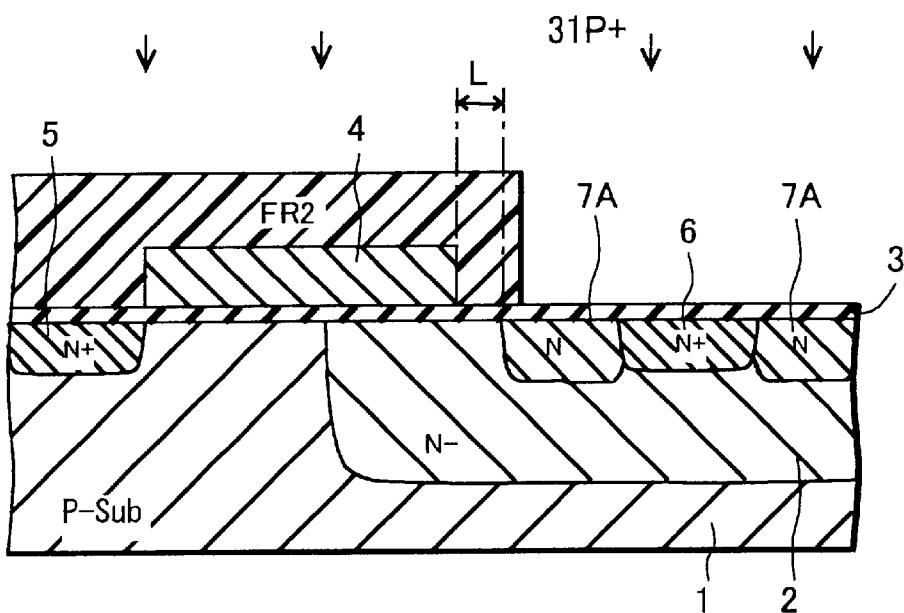
FIG. 7 is a section view showing a method of manufacturing a semiconductor device of a second embodiment of the present invention.

The characteristic of the semiconductor device of the second embodiment is that a middle concentration N type layer 7A is formed having the predetermined space (L) from one end portion (drain side) of said gate electrode 4 as shown in FIG. 7. Since electric field concentration at the end portion of the gate electrode 4 by forming the N type layer 7A having the predetermined space (L) from the end portion the gate electrode 4, higher sustaining voltage is designed.

In the above-mentioned method of manufacturing the semiconductor device, a middle concentration N type layer 7A is formed near the N+ type drain region 6 included in said N− type drain region having the predetermined space (L) from the other end portion of said gate electrode 4 as shown in FIG. 7 by ion implanting phosphorus ion ($^{31}$ P$^+$) for example, with about 160 KeV in acceleration voltage and about $2 \times 10^{12}$/cm$^2$ in implantation volume (dose) forming a photo-resist PR2 so as to overlap with the predetermined space from one end portion (drain side) of the gate electrode 4 after process in FIG. 1 and FIG. 2 described at the first embodiment. Therefore, a space from the gate electrode 4 (L) can be set freely by adjusting overlap quantity to the gate electrode 4 at forming the photo-resist PR2.

An another embodiment forming the above-mentioned middle 14 concentration N type layer having the predetermined space from one end (drain side) of the gate electrode 4 will be described below.

Figure 8:
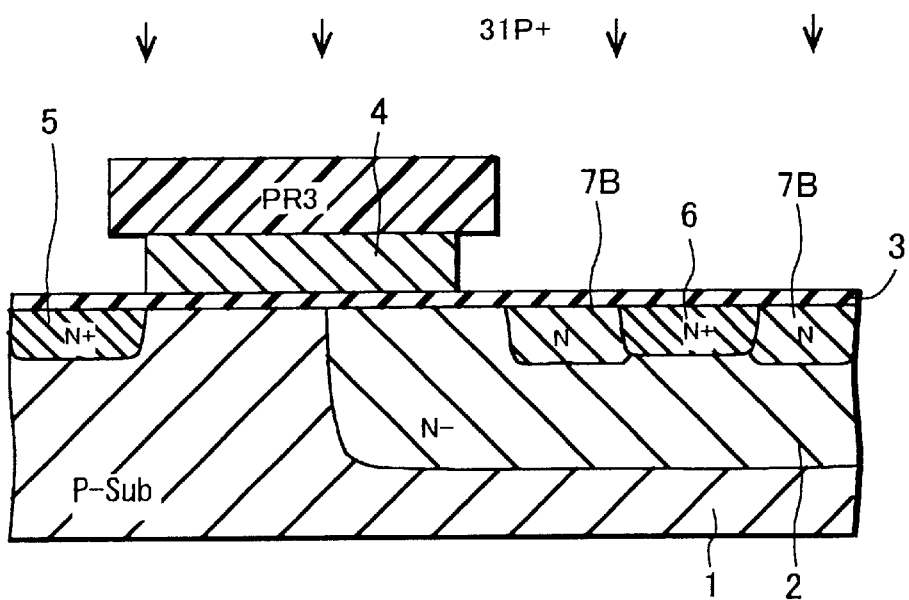
FIG. 8 is a section view showing a method of manufacturing a semiconductor device of a third embodiment of the present invention.

First, in a third embodiment, the above-mentioned construction is realized by ion implanting for N type layer forming by using a photo-resist PR3 used at patterning the gate electrode as shown in FIG. 8 as a mask.

That is, after process of FIG. 2 described in the first embodiment, a conductive film for gate electrode forming, for example, polysilicon film of 400 nm thickness is formed on a gate insulation film 3. After that, a gate electrode 4 is formed by patterning the polysilicon film by using the photo-resist PR3 formed on the polysilicon film as a mask. At this time, the gate electrode 4 is formed so as to get into the under portion of the photo-resist PR3 as shown in FIG. 8 by isotropic etching of the polysilicon.

Then, a middle concentration N type layer 7B is formed near the N+ type drain region 6 included in said N− type drain region 2 having the predetermined space (L) from the other end portion of said gate electrode 4 by ion-implanting phosphorus ion ($^{31}$ P$^+$), for example, with about 160 KeV in acceleration voltage and about $2 \times 10^2$/cm$^2$ in implantation volume (dose) by using the photo-resist PR3 remained on said gate electrode 4 in a cut-shape (visor-shape) forming a photo-resist PR2 so as to overlap with the predetermined space from one end portion (drain side) of the gate electrode 4, as a mask.

Thus, in the third embodiment, since ion implantation is carried out using the photo-resist PR3 for gate electrode patterning, there is no need to form newly the photo-resist FR2 for ion implantation so that operation efficiency is good.

Next, a fourth embodiment will be described.

Figure 9:
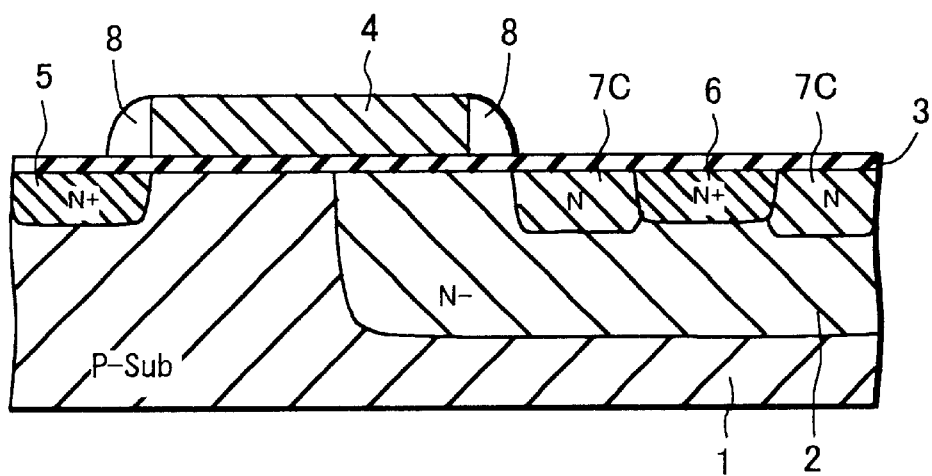
FIG. 9 is a section view showing a method of manufacturing a semiconductor device of a fourth embodiment of the present invention.

Here, a characteristic of the fourth embodiment is that the above-mentioned construction is realized by ion implanting for N type layer forming by using a side wall insulation film 8 and a gate electrode 4 by forming the side wall insulation film 8 so as to cover a side wall portion of the gate electrode 4 after forming the gate electrode 4 as shown in FIG. 9, as a mask.

That is, after process of FIG. 3 described in the first embodiment, an insulation film is formed by CVD method so as to cover the gate electrode on the gate insulation film 3. After that, a side wall insulation film 8 is formed at a side wall portion of the gate electrode 4.

Then, a middle concentration N type layer 7C is formed near the N+ type drain region 6 included in said N− type drain region having the predetermined space (L) from the other end of said gate electrode 4 by ion-implanting phosphorus ion ($^{31}$ P$^+$), for example, with about 160 KeV in acceleration voltage and about $2\times10^{12}/cm^2$ in implantation volume (dose) by using said side wall insulation film 8 and a photo-resist PR4 as a mask.

Thus, in the fourth embodiment, since the side wall insulation film 8 formed at the side wall portion of the gate electrode 4 is used as a part of the mask instead of the photo-resists PR2 and PR3 such as the second and third embodiments, forming positioning margin of the N type layer against a gap of mask matching worried at using the photo-resists PR2 and PR3 can be ensured. That is, in the embodiment, a space (L) from the end portion of the gate electrode 4 to the position where the N type layer 7C is formed is adjusted freely.

Further, a fifth embodiment will be described.

Figure 10:
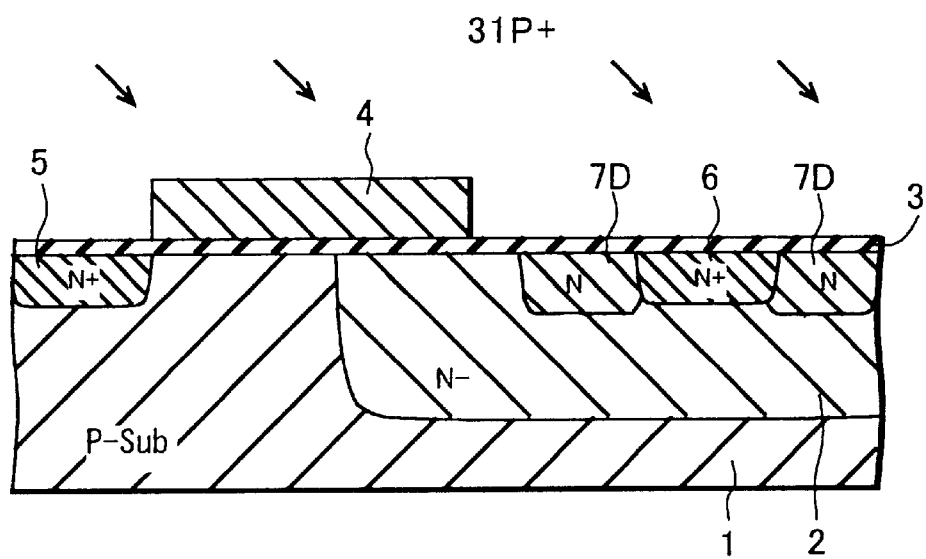
FIG. 10 is a section view showing a method of manufacturing a semiconductor device of a fifth embodiment of the present invention.

Here, a characteristic of the fifth embodiment is that the above-mentioned construction is realized by ion implantation for forming the N type layer from oblique upper side of the gate electrode 4 by using the gate electrode 4 as a mask after forming the gate electrode 4 as shown in FIG. 10.

That is, a middle concentration N type layer 7D is formed near the N+ type drain region 6 included in said N− type drain region 2 having the predetermined space (L) from the other end portion of said gate electrode 4 by ion implanting phosphorus ion ($^{31}$ P$^+$), for example, with about 160 KeV in acceleration voltage and about $2\times10^{12}/cm^2$ in implantation volume (dose) from oblique upper side of the gate electrode 4 by using the gate electrode 4 on the gate insulation film 3 as a mask after the process of FIG. 3 described in the first embodiment. At this time, depending on thickness of the gate electrode 4, a space (L) from the end portion of the gate electrode 4 to the position where the N type layer 7C is formed is adjusted freely by adjusting ion adjusting angle from oblique upper side of the gate electrode 4 (ion implantation of 30 degrees of oblique angle from vertical direction in the embodiment) freely.

Thus, in the fifth embodiment, the N type layer 7D having the predetermined space (L) from the gate electrode 4 can be formed by ion implantation from oblique upper side of the gate electrode 4, and number of manufacturing processes can be decreased comparing with manufacturing method using the photo-resists PR2 and PR3, and the side wall insulation film 8. Moreover, a space (L) from the end portion of said gate electrode 4 to the position where the N type layer 7D is formed can be adjusted only by adjusting freely ion implantation angle at ion implantation, so that operation efficiency is good.

Figure 11:
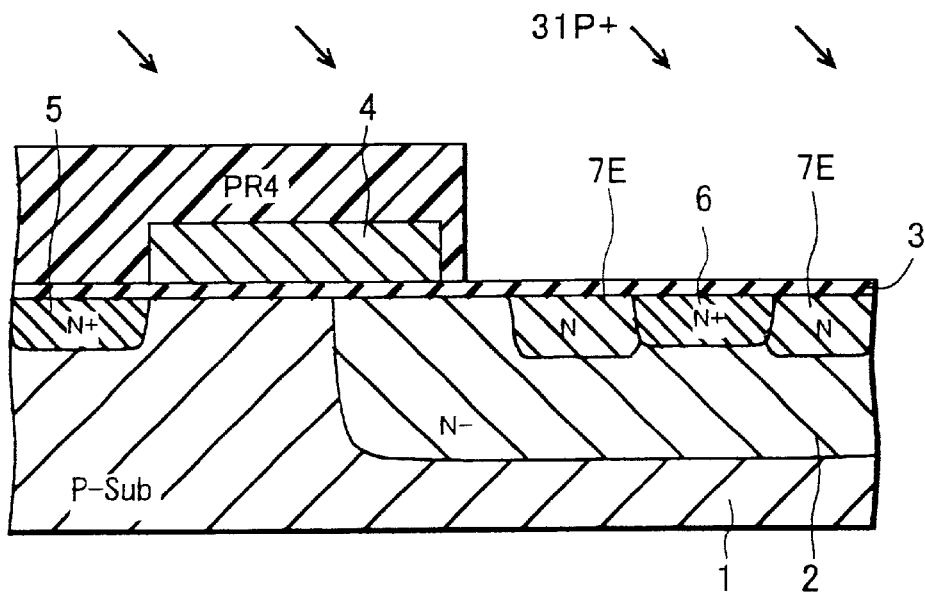
FIG. 11 is a section view showing a method of manufacturing a semiconductor device of a sixth embodiment of the present invention.
Figure 12:
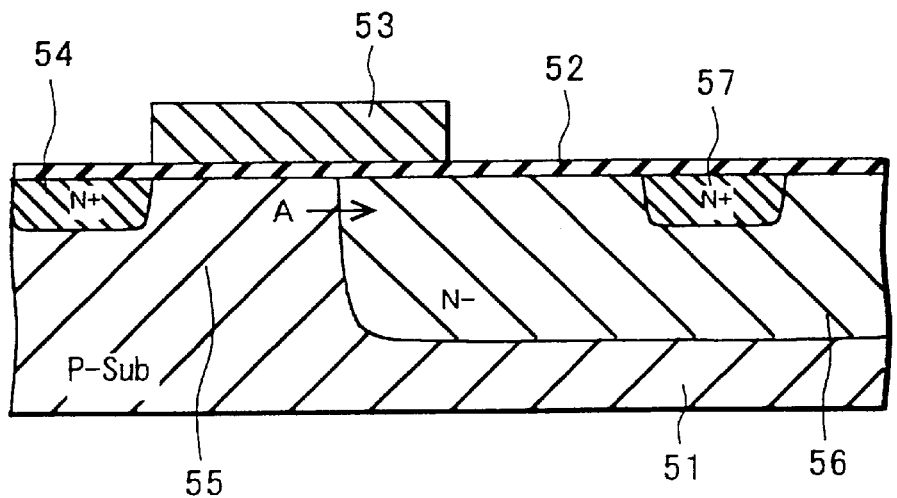
FIG. 12 is a section view showing the conventional semiconductor device.
Figure 13:
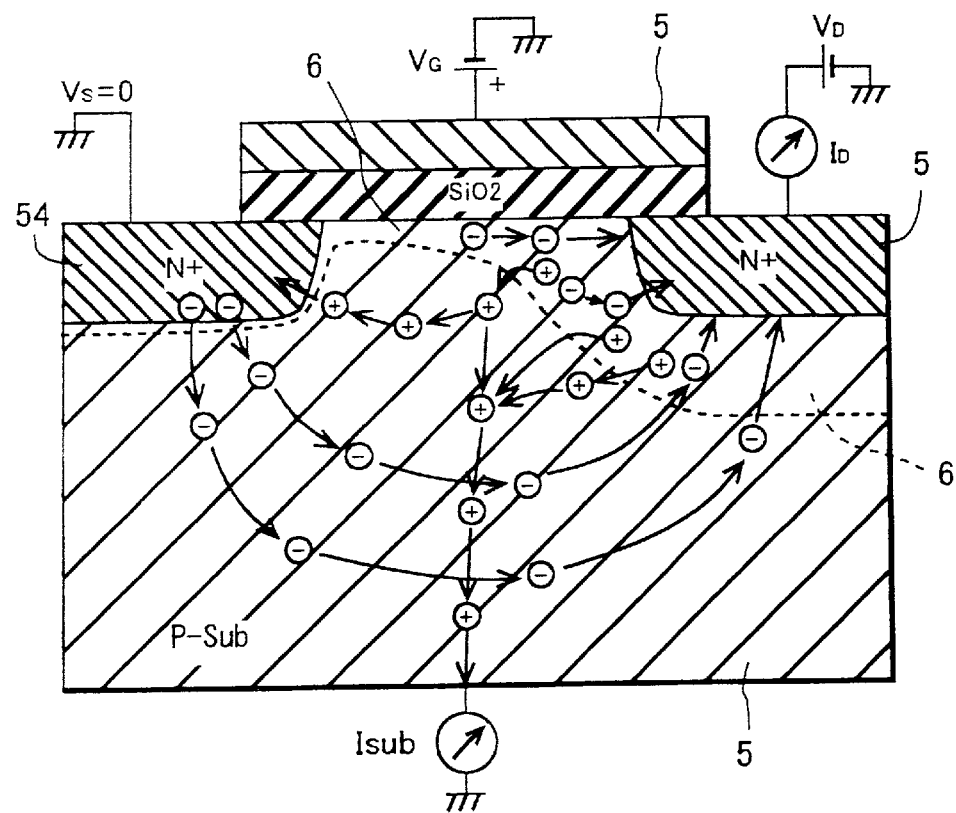
FIG. 13 is a section view of the semiconductor device for describing the mechanism of the conventional operation sustaining voltage drop.
Figure 14:
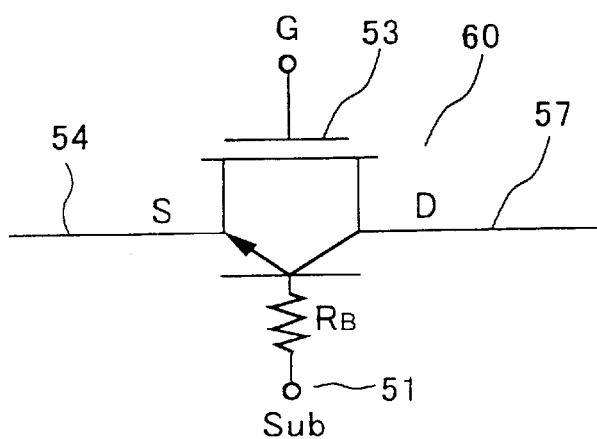
FIG. 14 is a view showing the equivalent circuit of the conventional parasitic bipolar transistor.
Figure 15:
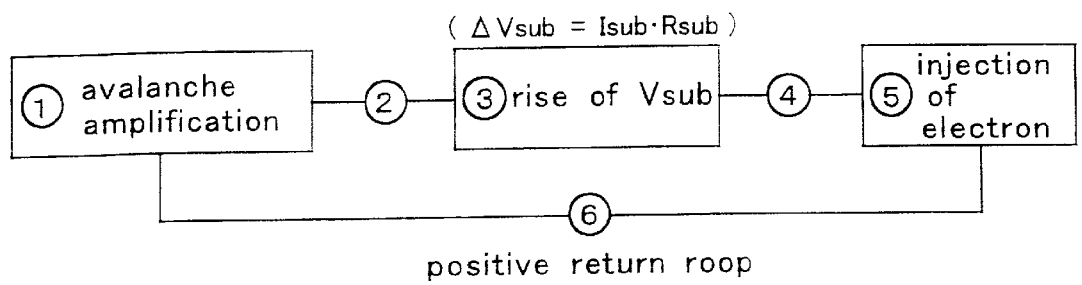
FIG. 15 is a view showing positive feedback loop for describing the mechanism of the conventional operation sustaining voltage drop.

In the process using such the oblique ion implantation method, ion implantation may be carried out from oblique direction using a photo-resist PR4 as shown in FIG. 11. Further, ion implantation may be carried out from oblique direction using a side wall insulation film instead of the photo-resist PR4.

Although an example that the invention is applied to a semiconductor device having one side LDD construction (having low concentration drain region and high concentration drain region at only region side) in each of the above-mentioned embodiments is described, the invention may be applied to both side LDD construction (having low concentration drain region and high concentration drain region at both of source and drain sides).

Further, although an example that the invention is applied for the N channel type MOS transistor in each of the above-mentioned embodiments, the invention may be applied for a P channel type MOS transistor.

According to the invention, the semiconductor device has high impurity concentration peak at the position of the predetermined depth in the substrate at region where is separated from the other end of the gate electrode and spans to a high concentration reverse conductive type drain region included in a low concentration reverse conductive type drain region, and forms a middle concentration reverse conductive type layer becoming low in high impurity concentration at region near surface of the substrate. Therefore, operation sustaining voltage improves. Especially, by forming said middle concentration reverse conductive type layer at the position separated the predetermined space from the end portion of said gate electrode, higher sustaining voltage becomes possible.

What is claimed is:

1. A semiconductor device comprising:
   a semiconductor substrate of a first conductive type;
   a gate insulating film disposed on the semiconductor substrate;
   a gate electrode formed on the gate insulation film;
   a high concentration source region of a second conductive type formed in the semiconductor substrate and adjacent to one end of said gate electrode;
   a low concentration drain region of the second conductive type formed in the semiconductor substrate and facing said source region through a channel region;
   a high concentration drain region of the second conductive type separated from the other end of said gate electrode and included in said low concentration drain region; and
   a middle concentration layer of the second conductive type spanning at least from a predetermined space from said gate electrode to said high concentration drain region, having a high impurity concentration peak at a position of a predetermined depth in said semiconductor substrate and formed so that high impurity concentration becomes low at a region near surface of the substrate.

2. A semiconductor device according to claim 1,
   wherein said middle concentration layer is formed at a region spanning from said gate electrode to said high concentration drain region.

3. The semiconductor device according to claim 1 further comprising:
   another middle concentration layer of the second conductive type disposed adjacent to the high concentration drain region at a side away from the gate electrode such that the two middle concentration layers sandwich the high concentration drain region.

4. The semiconductor device according to claim 1, wherein the first conductive type is opposite in conductivity to the second conductive type.

5. A semiconductor device comprising:

a semiconductor substrate of a first conductive type;

an gate insulating film disposed on the semiconductor substrate;

a gate electrode formed on the gate insulation film;

a low concentration source•drain region of a second conductive type formed in the semiconductor substrate and adjacent to one end of said gate electrode;

a high concentration source•drain region of the second conductive type separated from the other end of said gate electrode and included in said low concentration drain region; and a middle concentration layer of the second conductive type spanning at least from a predetermined space from said gate electrode to said high concentration reverse conductive type source•drain region, having a high impurity concentration peak at a position of a predetermined depth in said semiconductor substrate and formed so that high impurity concentration becomes low at a region near surface of the substrate.

6. A semiconductor device according to claim 5, wherein said middle concentration layer is formed at a region spanning from said gate electrode to said high concentration source•drain region.

* * * * *